(12) United States Patent
Kuwabara

(10) Patent No.: US 10,797,772 B2
(45) Date of Patent: Oct. 6, 2020

(54) PHASE SHIFTER, COMMUNICATION DEVICE, AND PHASE SHIFTING METHOD

(71) Applicant: NEC CORPORATION, Tokyo (JP)

(72) Inventor: Toshihide Kuwabara, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/491,653

(22) PCT Filed: Feb. 2, 2018

(86) PCT No.: PCT/JP2018/003661
§ 371 (c)(1),
(2) Date: Sep. 6, 2019

(87) PCT Pub. No.: WO2018/163682
PCT Pub. Date: Sep. 13, 2018

(65) Prior Publication Data
US 2020/0014443 A1    Jan. 9, 2020

(30) Foreign Application Priority Data
Mar. 9, 2017  (JP) ................................. 2017-044959

(51) Int. Cl.
*H04K 1/10* (2006.01)
*H04L 27/28* (2006.01)
(Continued)

(52) U.S. Cl.
CPC ............. *H04B 7/0617* (2013.01); *H01Q 3/34* (2013.01); *H04B 7/08* (2013.01)

(58) Field of Classification Search
CPC .......... H04B 7/0617; H04B 7/08; H01Q 3/34; H01P 1/18
(Continued)

(56) References Cited

U.S. PATENT DOCUMENTS

2013/0033296 A1* 2/2013 Kishimoto ............... H01P 1/18
327/237

FOREIGN PATENT DOCUMENTS

JP  2001-168668 A   6/2001
WO 2011/132348 A1  10/2011

OTHER PUBLICATIONS

Ioannis N. Bligiannis et al., "Ka-band VSAT 4-channel phased array receiver demonstrator," Eindhoven, Technische Universiteit Eindhoven, 2015, pp. 23-35b.
(Continued)

*Primary Examiner* — Phuong Phu
(74) *Attorney, Agent, or Firm* — Sughrue Mion, PLLC

(57) ABSTRACT

A phase shifter (60) is provided corresponding to an antenna element constituting an array antenna and is configured to change a phase of a radio frequency signal to be transmitted or received by a corresponding antenna element. The phase shifter (60) includes a first distributor (61) configured to distribute the radio frequency signal input thereto into a plurality of first distributed signals having mutually different phases; second distributors (62) provided corresponding to the first distributed signals, the second distributors each being configured to distribute a corresponding one of the first distributed signals into a plurality of second distributed signals having mutually different amplitudes; a controller (63) configured to control on/off of the second distributed signals; and a combiner (64) configured to combine the second distributed signals that are controlled on by the controller (63).

6 Claims, 11 Drawing Sheets

(51) Int. Cl.
  *H04B 7/06* (2006.01)
  *H01Q 3/34* (2006.01)
  *H04B 7/08* (2006.01)

(58) Field of Classification Search
  USPC .................................. 375/260, 297, 345
  See application file for complete search history.

(56) References Cited

OTHER PUBLICATIONS

Hideki Kirino et al., "A Variable Phase Shifter Using a Movable Waffle Iron Metal Plate and Its Applications to Phased Array Antennas", IEICE TRANS.COMMUN., Jun. 2008, pp. 1773-1782, vol. E91-B, No. 6.

Mikko Kyro et al., "5x1 Linear Antenna Array for 60 GHz Beam Steering Applications", European Conference on Antennas and Propagation, Apr. 2011, Rome, Italy. 4 p., 2011. <hal-00670144>, 6 pages.

International Search Report for PCT/JP2018/003661, dated Apr. 24, 2018.

* cited by examiner

| 4-bit CONTROL VALUE | PASS AMPLITUDE RATIO x(n) | cos(N×10°) | PHASE[°] |
|---|---|---|---|
| 1111 | 1.0 | 1.0 | 0 (N=0) |
| 1111 | 1.0 | 0.98 | 10 (N=1) |
| 1110 | 0.90 | 0.94 | 20 (N=2) |
| 1101 | 0.84 | 0.87 | 30 (N=3) |
| 1100 | 0.74 | 0.77 | 40 (N=4) |
| 0111 | 0.61 | 0.64 | 50 (N=5) |
| 0110 | 0.51 | 0.50 | 60 (N=6) |
| 0100 | 0.35 | 0.34 | 70 (N=7) |
| 0010 | 0.16 | 0.17 | 80 (N=8) |
| 0000 | 0.0 | 0.0 | 90 (N=9) | ized in the communication devices are so disposed as to perfectly face each other.

PHASE SHIFTER, COMMUNICATION DEVICE, AND PHASE SHIFTING METHOD

CROSS REFERENCE TO RELATED APPLICATIONS

This application is a National Stage of International Application No. PCT/JP2018/003661 filed Feb. 2, 2018, claiming priority based on Japanese Patent Application No. 2017-044959 filed Mar. 9, 2017, the entire disclosure of which is incorporated herein.

TECHNICAL FIELD

The present invention relates to phase shifters, communication devices, and phase shifting methods and relates, in particular, to a technique for achieving a beam steering function by changing the phase of signals with phase shifters provided corresponding to respective antenna elements constituting an array antenna.

BACKGROUND ART

In wireless communication, increasing directivity of antennas in communication devices enables transmission over a relatively long distance. When the directivity of antennas is too strong, however, required electric-field strength cannot be obtained unless the communication devices are so disposed as to perfectly face each other.

Therefore, for communication devices, it is preferable to facilitate installation of communication devices by achieving a beam steering function. This expectably facilitates installation of communication devices used in fixed telecommunication with microwaves and millimeter waves, for example.

For communication devices, achieving the beam steering function also brings about an expectation that the communication devices can find their use in a variety of modes. For example, even when a communication device experiences large vibrations at its installation location and the orientation of the antenna cannot be fixed, achieving the beam steering function makes it possible to maintain an optimal communication path or allows, after the communication device is installed, a communication device on another end to be changed.

Also in 5G, which is a next-generation mobile communication system, it is conceivable that the beam steering function is essential in order to achieve Massive-Multi-Input Multi-Output (MIMO) that uses millimeter waves.

For communication devices, considered now is a configuration in which phase shifters are provided corresponding to respective antenna elements of an array antenna and the beam steering function is achieved by changing the phase of signals with the phase shifters. Such a configuration is disclosed in Non Patent Literature 1, for example. FIG. 5 in Non Patent Literature 1 discloses, as a system that changes the phase of a signal with a phase shifter, a system that changes the phase of a baseband signal or an intermediate frequency (IF) signal and a system that changes the phase of a radio frequency (RF) signal. These two systems will be described below. In the drawings described below, identical elements are given identical reference characters, and their duplicate descriptions will be omitted as necessary.

(1) RELATED ART 1

First, as Related Art 1, with reference to FIG. 10, a circuit configuration example of a communication device 800 of a system that changes the phase of a baseband signal or an IF signal with a phase shifter will be described. FIG. 10 illustrates, of the configuration of the communication device 800, only a configuration covering from a modem 11 to a transmission antenna element 27 and a reception antenna element 31, and the remaining configuration is omitted.

As illustrated in FIG. 10, the communication device 800 according to Related Art 1 includes the modem 11, a digital/analog (D/A) converter 21, a phase shifter 22, a mixer 23, a voltage-controlled oscillator (VCO) 24, a variable amplifier 25, an amplifier 26, the transmission antenna element 27, the reception antenna element 31, an amplifier 32, a mixer 33, a VCO 34, a phase shifter 35, a variable amplifier 36, and an analog/digital (A/D) converter 37.

The D/A converter 21 converts a transmission baseband signal or a transmission IF signal output from the modem 11 from a digital signal to an analog signal and outputs the resulting signal.

The phase shifter 22 changes the phase of the transmission baseband signal or the transmission IF signal output from the D/A converter 21 and outputs the resulting signal. The mixer 23 mixes the transmission baseband signal or the transmission IF signal output from the phase shifter 22 with a local oscillator (LO) signal generated by the VCO 24 to produce a transmission RF signal and outputs the transmission RF signal. The variable amplifier 25 is an amplifier with a variable pass gain. The variable amplifier 25 amplifies the transmission RF signal output from the mixer 23 and outputs the resulting signal. The amplifier 26 amplifies the transmission RF signal output from the variable amplifier 25 and outputs the resulting signal.

The transmission antenna element 27 is one of the antenna elements constituting a transmission array antenna. The transmission antenna element 27 transmits the transmission RF signal output from the amplifier 26 to a communication device on another end (not illustrated).

A transmitter (TX) circuit 28 constituted by the phase shifter 22, the mixer 23, the variable amplifier 25, and the amplifier 26 and enclosed by a dashed line in FIG. 10 is provided for each transmission antenna element 27.

The reception antenna element 31 is one of the antenna elements constituting a reception array antenna. The reception antenna element 31 receives an RF signal (referred to below as a reception RF signal) transmitted from a communication device on another end.

The amplifier 32 amplifies the reception RF signal received by the reception antenna element 31 and outputs the resulting signal. The mixer 33 mixes the reception RF signal output from the amplifier 32 with an LO signal generated by the VCO 34 to produce a reception baseband signal or a reception IF signal and outputs the resulting signal. The phase shifter 35 changes the phase of the reception baseband signal or the reception IF signal output from the mixer 33 and outputs the resulting signal. The variable amplifier 36 is an amplifier with a variable pass gain. The variable amplifier 36 amplifies the reception baseband signal or the reception IF signal output from the phase shifter 35 and outputs the resulting signal.

The A/D converter 37 converts the reception baseband signal or the reception IF signal output from the variable amplifier 36 from an analog signal to a digital signal and outputs the resulting signal to the modem 11.

A receiver (RX) circuit 38 constituted by the amplifier 32, the mixer 33, the phase shifter 35, and the variable amplifier 36 and enclosed by a dashed line in FIG. 10 is provided for each reception antenna element 31.

As described above, the communication device 800 according to Related Art 1 achieves the beam steering function by changing the phase of a baseband signal or an IF signal with the phase shifter 22 provided corresponding to each transmission antenna element 27 and with the phase shifter 35 provided corresponding to each reception antenna element 31. Typically, it is easier to implement a phase shifter for a baseband signal or an IF signal than for an RF signal, such as a millimeter wave. Therefore, the system of Related Art 1 is a frequently employed system.

However, if the TX circuit 28 and the RX circuit 38 are each to be implemented with a single integrated circuit (IC), the circuit size to be integrated into the IC becomes large, making it difficult to design the communication device 800. Therefore, the difficulty in achieving the beam steering function increases.

When an IF signal is used, an image signal and a carrier leak signal generated in the mixer 23 need to be removed in the transmitter side. Thus, a filter needs to be disposed between the amplifier 26 and the transmission antenna element 27 to make a transmission RF signal pass through this filter. However, it is difficult to form not only a millimeter-wave filter but any filter with high performance on a semiconductor, and it is thus difficult to form a filter on the IC that implements the TX circuit 28. If a filter is to be provided outside the IC that implements the TX circuit 28, since the space between antenna elements in a millimeter-wave array antenna is very small, it is difficult to secure a site where the filter is mounted due to also a very large number of components.

Meanwhile, when a baseband signal is used, in the transmitter side, a carrier leak signal generated in the mixer 23 needs to be suppressed at every transmission antenna element 27 constituting the transmission array antenna, but it is difficult to suppress a carrier leak signal, including the temperature characteristics, with high accuracy. Aside from the carrier leak signal, all the analog circuits, such as the mixer 23, the variable amplifier 25, and the amplifier 26, have temperature characteristics. Therefore, when the circuit size of the IC that implements the TX circuit 28 is large, compensation of the temperature characteristics of all of the above needs to be considered, and the difficulty in achieving the beam steering function further increases. A relatively large number of signal interfaces are to be provided in the TX circuit 28 and the RX circuit 38 for a baseband signal or an IF signal, an LO signal, and an RF signal, and also for the power source of each element. Furthermore, the portions of the TX circuit 28 and the RX circuit 38 that need to be controlled spread broadly including, aside from the settings of the phase shifters 22 and 35, a temperature compensation circuit that compensates for the temperature characteristics of each analog element and the gains of the variable amplifiers 25 and 36 in some cases, leading to an increased number of wires. This increases the difficulty in mounting the communication device 800, and an even increased difficulty in achieving the beam steering function is expected.

(2) RELATED ART 2

Now, as Related Art 2, with reference to FIG. 11, a circuit configuration example of a communication device 900 of a system that changes the phase of an RF signal with a phase shifter will be described. FIG. 11 illustrates, of the configuration of the communication device 900, only a configuration covering from a modem 11 to a transmission antenna element 48 and a reception antenna element 51, and the remaining configuration is omitted.

As illustrated in FIG. 11, the communication device 900 according to Related Art 2 includes the modem 11, a D/A converter 41, a mixer 42, a VCO 43, a variable amplifier 44, a bandpass filter (BPF) 45, a phase shifter 86, an amplifier 47, the transmission antenna element 48, the reception antenna element 51, an amplifier 52, a phase shifter 93, a BPF 54, a mixer 55, a VCO 56, a variable amplifier 57, and an A/D converter 58.

The D/A converter 41 converts a transmission baseband signal or a transmission IF signal output from the modem 11 from a digital signal to an analog signal and outputs the resulting signal. The mixer 42 mixes the transmission baseband signal or the transmission IF signal output from the D/A converter 41 with an LO signal generated by the VCO 43 to produce a transmission RF signal and outputs the transmission RF signal. The variable amplifier 44 is an amplifier with a variable pass gain. The variable amplifier 44 amplifies the transmission RF signal output from the mixer 42 and outputs the resulting signal. The BPF 45 allows, of the transmission RF signal output from the variable amplifier 44, only the transmission RF signal in a desired frequency band to pass therethrough.

The phase shifter 86 changes the phase of the transmission RF signal that has passed through the BPF 45 and outputs the resulting signal. The amplifier 47 amplifies the transmission RF signal output from the phase shifter 86 and outputs the resulting signal.

The transmission antenna element 48 is one of the antenna elements constituting a transmission array antenna. The transmission antenna element 48 transmits the transmission RF signal output from the amplifier 47 to a communication device on another end (not illustrated).

A TX circuit 89 constituted by the phase shifter 86 and the amplifier 47 and enclosed by a dashed line in FIG. 11 is provided for each transmission antenna element 48.

The reception antenna element 51 is one of the antenna elements constituting a reception array antenna. The reception antenna element 51 receives an RF signal (referred to below as a reception RF signal) transmitted from a communication device on another end.

The amplifier 52 amplifies the reception RF signal received by the reception antenna element 51 and outputs the resulting signal. The phase shifter 93 changes the phase of the reception RF signal output from the amplifier 52 and outputs the resulting signal.

The BPF 54 allows, of the reception RF signal output from the phase shifter 93, only the reception RF signal in a desired frequency band to pass therethrough. The mixer 55 mixes the reception RF signal that has passed through the BPF 54 with an LO signal generated by the VCO 56 to produce a reception baseband signal or a reception IF signal and outputs the resulting signal. The variable amplifier 57 is an amplifier with a variable pass gain. The variable amplifier 57 amplifies the reception baseband signal or the reception IF signal output from the mixer 55 and outputs the resulting signal. The A/D converter 58 converts the reception baseband signal or the reception IF signal output from the variable amplifier 57 from an analog signal to a digital signal and outputs the resulting signal to the modem 11.

An RX circuit 99 constituted by the amplifier 52 and the phase shifter 93 and enclosed by a dashed line in FIG. 11 is provided for each reception antenna element 51.

As described above, the communication device 900 according to Related Art 2 achieves the beam steering function by changing the phase of an RF signal with the phase shifter 86 provided corresponding to each transmission antenna element 48 and with the phase shifter 93 provided corresponding to each reception antenna element 51. The TX circuit 89 and the RX circuit 99 have a smaller circuit size and a smaller number of signal interfaces than the TX circuit 28 and the RX circuit 38 according to Related Art 1. This provides an advantage when the TX circuit 89 and the RX circuit 99 are each to be implemented with a single IC. However, it is difficult to implement the phase shifters 86 and 93 that change the phase of an RF signal, and thus the difficulty in achieving the beam steering function increases. This point will be described below.

For example, the phase shifters 86 and 93 may each be implemented by a voltage-controlled phase shifter that includes a variable capacitance element (see, for example, FIG. 4 in Non Patent Literature 2). When the phase shifters 86 and 93 are to be implemented with a voltage-controlled phase shifter that includes a variable capacitance element, unlike Related Art 1, the filter that allows a transmission RF signal to pass therethrough does not need to be provided in the transmitter side. However, it is difficult to implement a variable capacitance element with such a high Q-value that can ensure its performance with millimeter waves. In addition, since a voltage-controlled phase shifter has temperature characteristics, a certain mechanism for compensating for the temperature needs to be considered.

The phase shifters 86 and 93 may each be implemented also by a step phase shifter that includes a delay line and an RF switch. In such a step phase shifter, multiple sets of delay lines and RF switches are connected in stages, and the phase is changed by switching a delay line connected to a main transmission path with an RF switch (see, for example, FIG. 5 in Non Patent Literature 3). However, when the phase shifters 86 and 93 are to be implemented with a step phase shifter that includes a delay line and an RF switch, an RF switch with a small pass loss in millimeter waves and with high blocking characteristics is required, but it is relatively difficult to implement such an RF switch. Even if such an RF switch can be implemented, RF switches need to be connected in multiple stages, and the pass loss increases inevitably.

CITATION LIST

Non Patent Literature

Non Patent Literature 1: Ioannis N. Bligiannis, supervisors A. B. Smolders, P. G. M. Baltus, "Ka-band VSAT 4-channel phased array receiver demonstrator," Eindhoven, Technische Universiteit Eindhoven, 2015
Non Patent Literature 2: Hideki KIRINO, Koichi OGAWA, Takeshi OHNO, et al., "A Variable Phase Shifter Using a Movable Waffle Iron Metal Plate and Its Applications to Phased Array Antennas," IEICE TRANS. COMMUN., VOL. E91-B, NO. 6 JUNE 2008
Non Patent Literature 3: Mikko Kyro, Diane Titz, Veli-Matti Kolmonen, Sylvain Ranvier, Patrick Pons, et al., "5×1 Linear Antenna Array for 60 GHz Beam Steering Applications," European Conference on Antennas and Propagation, April 2011, Rome, Italy. 4 p., 2011. <hal-00670144>

SUMMARY OF INVENTION

Technical Problem

As described above, Related Arts 1 and 2 suffer from shortcomings in that it is difficult to achieve the beam steering function by changing the phase of a signal with a phase shifter provided corresponding to each antenna element of an array antenna.

Accordingly, the present invention is directed to overcoming the above shortcomings and to providing a phase shifter, a communication device, and a phase shifting method capable of achieving the beam steering function with ease.

Solution to Problem

In one aspect, a phase shifter is a phase shifter provided corresponding to an antenna element constituting an array antenna, the phase shifter being configured to change a phase of a radio frequency signal to be transmitted or received by a corresponding antenna element, the phase shifter comprising:
 a first distributor configured to distribute the radio frequency signal input thereto into a plurality of first distributed signals having mutually different phases;
 second distributors provided corresponding to the first distributed signals, the second distributors each being configured to distribute a corresponding one of the first distributed signals into a plurality of second distributed signals having mutually different amplitudes;
 a controller configured to control on/off of the second distributed signals; and
 a combiner configured to combine the second distributed signals that are controlled on by the controller.

In one aspect, a communication device is a communication device equipped with a beam steering function, the communication device comprising:
 a transmission array antenna;
 a plurality of first phase shifters provided corresponding to respective transmission antenna elements constituting the transmission array antenna, the plurality of first phase shifters each being configured to change a phase of a radio frequency signal to be transmitted by a corresponding transmission antenna element;
 a reception array antenna; and
 a plurality of second phase shifters provided corresponding to respective reception antenna elements constituting the reception array antenna, the plurality of second phase shifters each being configured to change a phase of a radio frequency signal received by a corresponding reception antenna element,
 wherein the first and second phase shifters each include
  a first distributor configured to distribute the radio frequency signal input thereto into a plurality of first distributed signals having mutually different phases,
  second distributors provided corresponding to the first distributed signals, the second distributors each being configured to distribute a corresponding one of the first distributed signals into a plurality of second distributed signals having mutually different amplitudes,
  a controller configured to control on/off of the second distributed signals, and
  a combiner configured to combine the second distributed signals that are controlled on by the controller.

In one aspect, a phase shifting method is a phase shifting method for a phase shifter provided corresponding to an antenna element constituting an array antenna, the phase shifter being configured to change a phase of a radio frequency signal to be transmitted or received by a corresponding antenna element, the phase shifting method comprising:

distributing the input radio frequency signal into a plurality of first distributed signals having mutually different phases;

distributing the first distributed signals into respective pluralities of second distributed signals having mutually different amplitudes;

controlling on/off of the second distributed signals; and combining the second distributed signals that are controlled on.

Advantageous Effects of Invention

The above aspects provides an advantageous effect that a phase shifter, a communication device, and a phase shifting method capable of achieving the beam steering function with ease can be provided.

DESCRIPTION OF EMBODIMENTS

Hereinafter, example embodiments of the present invention will be described with reference to the drawings.

Figure 1:
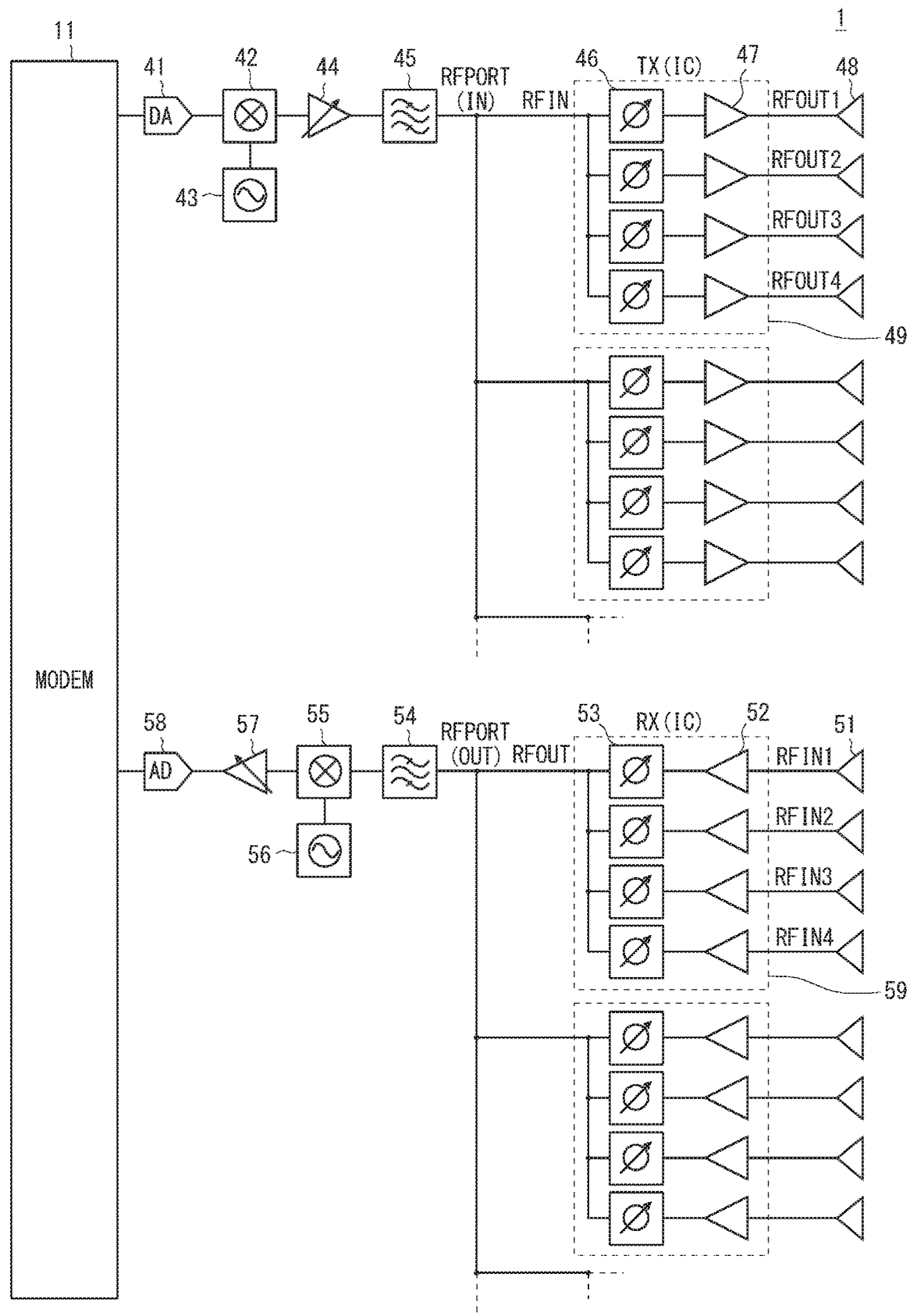
FIG. 1 is a circuit diagram illustrating a circuit configuration example of a communication device according to an example embodiment.

First, with reference to FIG. 1, a circuit configuration example of a communication device 1 according to the present example embodiment will be described. FIG. 1 illustrates, of the configuration of the communication device 1, only a configuration covering from a modem 11 to transmission antenna elements 48 and reception antenna elements 51, and the remaining configuration is omitted.

Figure 11:
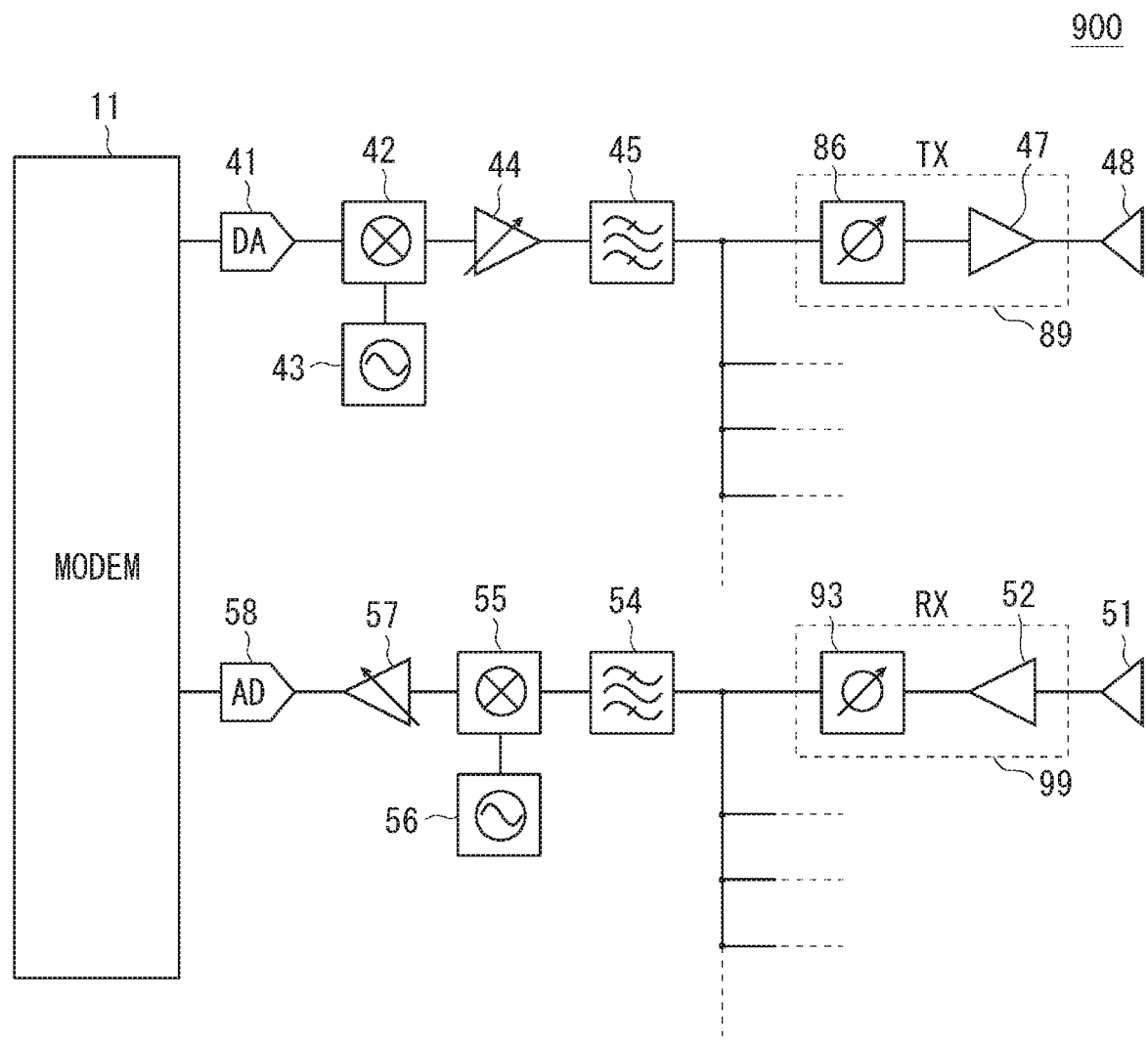
FIG. 11 is a circuit diagram illustrating a circuit configuration example of a communication device according to Related Art 2.

As illustrated in FIG. 1, the communication device 1 according to the present example embodiment differs from the communication device 900 according to Related Art 2 illustrated in FIG. 11 in that phase shifters that change the phase of RF signals are changed from the phase shifters 86 and 93 to phase shifters 46 and 53 (first and second phase shifters).

The phase shifters 46 and 53 according to the present example embodiment will be described below. The phase shifters 46 and 53 have a substantially identical configuration, and thus a configuration of the phase shifter 46 will be described below as an example.

Figure 2:
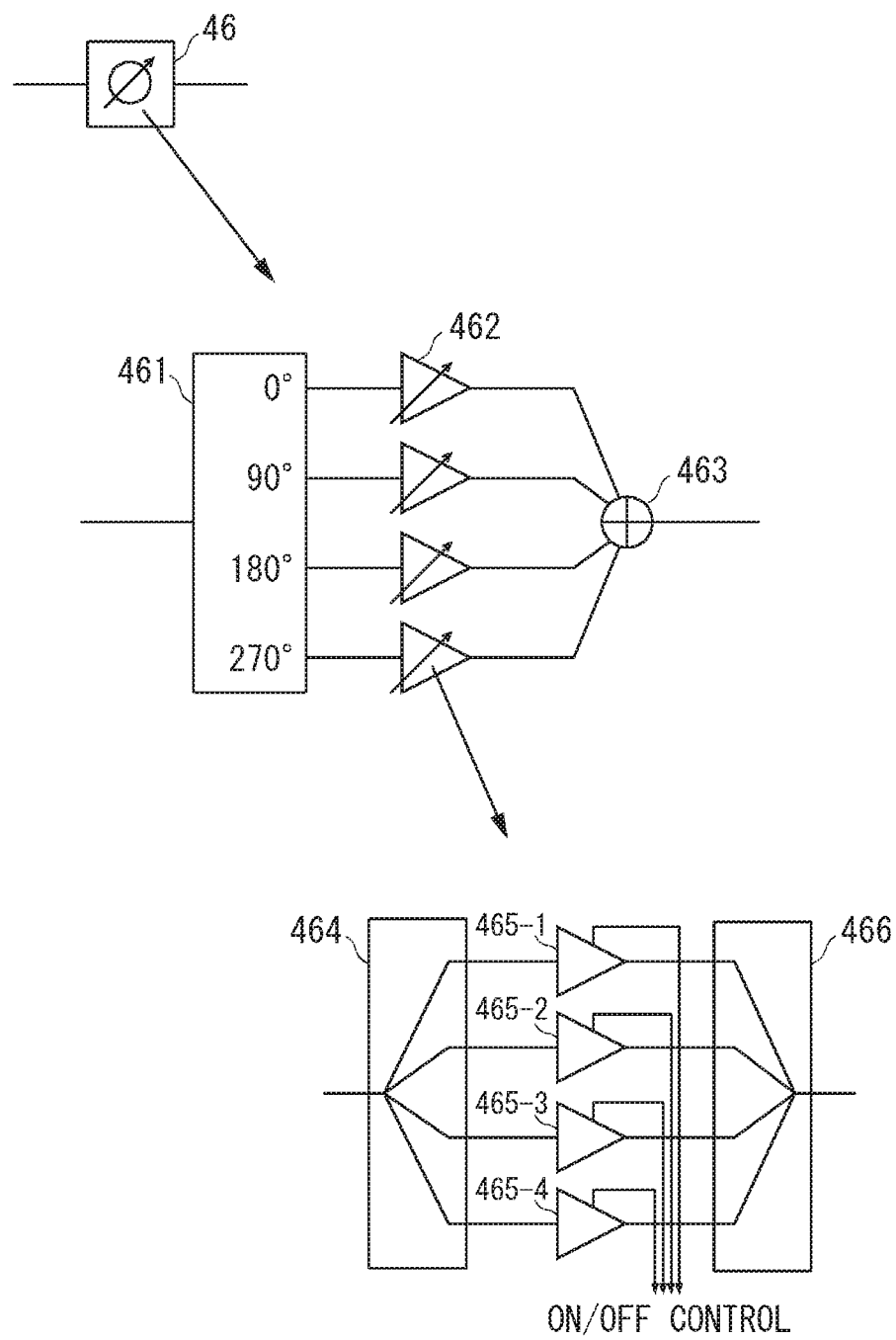
FIG. 2 is a circuit diagram illustrating a circuit configuration example of a phase shifter according to an example embodiment.

With reference to FIG. 2, a configuration example of the phase shifter 46 according to the present example embodiment will be described. As illustrated in FIG. 2, the phase shifter 46 according to the present example embodiment includes a distributor 461 serving as a first distributor, four variable amplifiers 462 disposed in parallel, and a combiner 463 serving as a second combiner.

The distributor 461 distributes a transmission RF signal that has passed through a BPF 45 into n transmission RF signals (first distributed signals) having mutually different phases and outputs the n transmission RF signals (n is a natural number no smaller than 2). In the present example embodiment, n is 4, and the distributor 461 distributes a transmission RF signal that has passed through the BPF 45 into four transmission RF signals having phases that differ in steps of 90° and outputs the four transmission RF signals. Thus, the transmission RF signal that has passed through the BPF 45 is distributed into the four signals: a 0-degree signal having a phase of 0°, a 90-degree signal having a phase of 90°, a 180-degree signal having a phase of 180°, and a 270-degree signal having a phase of 270°. The distributor 461 can be implemented, for example, by a 90-degree hybrid and a 180-degree balun. A 90-degree hybrid and a 180-degree balun have a sufficiently smaller size relative to an IC in millimeter waves and can thus be fabricated with a wiring layer on an IC. In the present example embodiment, n is 4 as one example, but n may be any desired value and may, for example, be 8.

The four variable amplifiers 462 are provided corresponding to the respective transmission RF signals distributed by the distributor 461. The variable amplifiers 462 are each an amplifier with a variable pass gain. The variable amplifiers 462 each amplify a corresponding transmission RF signal and outputs the resulting signal.

The combiner 463 combines the four transmission RF signals output from the respective variable amplifiers 462 and outputs the resulting signal.

In the phase shifter 46, the distributor 461 distributes a transmission RF signal into four signals having phases that differ in steps of 90°, two of the four distributed transmission RF signals are selected, the variable amplifiers 462 change the amplitudes of the selected two transmission RF signals as appropriate, and the combiner 463 combines these two signals. Thus, the phase shifter 46 can generate equal-amplitude transmission RF signals at desired phases.

Two transmission RF signals can be selected from the four transmission RF signals as follows. For example, amplifiers 465 (described later) within the two variable amplifiers 462 corresponding to the respective transmission RF signals that are not to be selected are powered off through control signals (described later).

The variable amplifiers 462 each include a distributor 464 serving as a second distributor, four amplifiers 465-1 to 465-4 disposed in parallel (when not referring to any particular one of the amplifiers 465-1 to 465-4, the amplifiers 465-1 to 465-4 are referred to as amplifier(s) 465, as appropriate), and a combiner 466 serving as a first combiner.

The distributor 464 distributes a corresponding transmission RF signal of the transmission RF signals distributed by the distributor 461 into m transmission RF signals (second distributed signals) having mutually different amplitudes and outputs the m transmission RF signals (m is a natural number no smaller than 2). In the present example embodiment, m is 4, and the distributor 464 distributes each transmission RF signal distributed by the distributor 461 into four transmission RF signals having mutually different amplitudes and outputs the four transmission RF signals. The distributor 464 is assigned an unequal distribution ratio and distributes a transmission RF signal distributed by the distributor 461 into four transmission RF signals by multiplying the amplitude of the transmission RF signal with each constituting number of the unequal distribution ratio. In the present example embodiment, m is 4 as one example, but m may be any desired value and may be, for example, 3. In that case, an assumption is that the distribution ratio of the distributor 464 and the combining ratio of the combiner 466 are so controlled as to optimize the characteristics of the phase shifter 46.

The four amplifiers 465 are provided corresponding to the respective transmission RF signals distributed by the distributor 464. The amplifiers 465 each amplify a corresponding transmission RF signal and outputs the resulting signal. The power source of each amplifier 465 can be controlled on/off through a control signal from a controller (not illustrated). In the present example embodiment, the amplifiers 465 are provided as one example, but in place of the amplifiers 465, RF switches of which the power sources can be controlled on/off through control signals may be provided.

The combiner 466 combines the four transmission RF signals output from the respective amplifiers 465 and outputs the resulting signal. The combiner 466 is assigned an unequal combining ratio, like the combining ratio of the distributor 464, and combines the four transmission RF signals upon multiplying the amplitudes of the four transmission RF signals with respective constituting numbers of the unequal combining ratio.

The distributor 464 and the combiner 466 have identical circuit elements in principle, and the distributor 464 with its input and output reversed corresponds to the combiner 466. In this case, the distribution ratio of the distributor 464 and the combining ratio of the combiner 466 are identical. However, the distribution ratio and the combining ratio may differ from each other.

In each variable amplifier 462, the distributor 464 unequally distributes a transmission RF signal into four signals, the four amplifiers 465 amplify the respective distributed transmission RF signals, and the combiner 466 recombines the four transmission RF signals output from the respective amplifiers 465. The power sources of the four amplifiers 465 can be controlled on/off. Thus, the pass gain of the variable amplifier 462, that is, the amplitude of the transmission RF signal can be controlled.

The amplitude of a transmission RF signal can also be controlled with an analog gain control circuit. In this case, however, the amount of gain control with respect to a control voltage applied to the gain control circuit may vary due to manufacturing variations or may experience temperature variations. Therefore, some kind of testing needs to be performed on each piece, and certain compensation needs to be made.

In contrast, in the communication device 1 according to the present example embodiment, the amplitude of a transmission RF signal is controlled through 4-bit control with on/off of the power sources of the four amplifiers 465 disposed in parallel. In this case, although the pass gain of a transmission antenna element 48 as a whole may experience a change in the characteristics associated with the temperature, the relative amplitudes of the four amplifiers 465 do not change, and the phase characteristics are thus maintained. In the end, the temperature-associated change in the characteristics involves only the variation in the pass gain of the transmission antenna element 48 as a whole, and this variation merely needs to be absorbed at a final input/output of the transmission RF signal.

Therefore, in the communication device 1 according to the present example embodiment, the temperature-associated change in the characteristics of the pass gain of a transmission antenna element 48 as a whole merely needs to be absorbed in the amplifier 47 that outputs an transmission RF signal to the transmission antenna element 48. Although not illustrated, in a receiver side, the temperature-associated change in the characteristics of the pass gain of a reception antenna element 51 as a whole merely needs to be absorbed in the amplifier 52 that receives a reception RF signal from the reception antenna elements 51.

In this manner, in the communication device 1 according to the present example embodiment, since the temperature-associated change in the characteristics merely needs to be absorbed in the amplifiers 47 and 52, the temperature characteristics are compensated for with ease. Unlike a voltage-controlled phase shifter, the phase shifters 46 and 53 do not include a variable capacitance element. In addition, unlike a step phase shifter, the phase shifters 46 and 53 do not require a configuration where RF switches are connected in multiple stages. Consequently, the beam steering function can be implemented with ease with the use of an IC.

Accordingly, in the communication device 1 according to the present example embodiment, a TX circuit 49 that includes four circuits each constituted by a phase shifter 46 and an amplifier 47 provided for each transmission antenna element 48 is implemented with a single IC. In addition, an RX circuit 59 that includes four circuits each constituted by a phase shifter 53 and an amplifier 52 provided for each reception antenna element 51 is implemented with a single IC.

Figure 3:
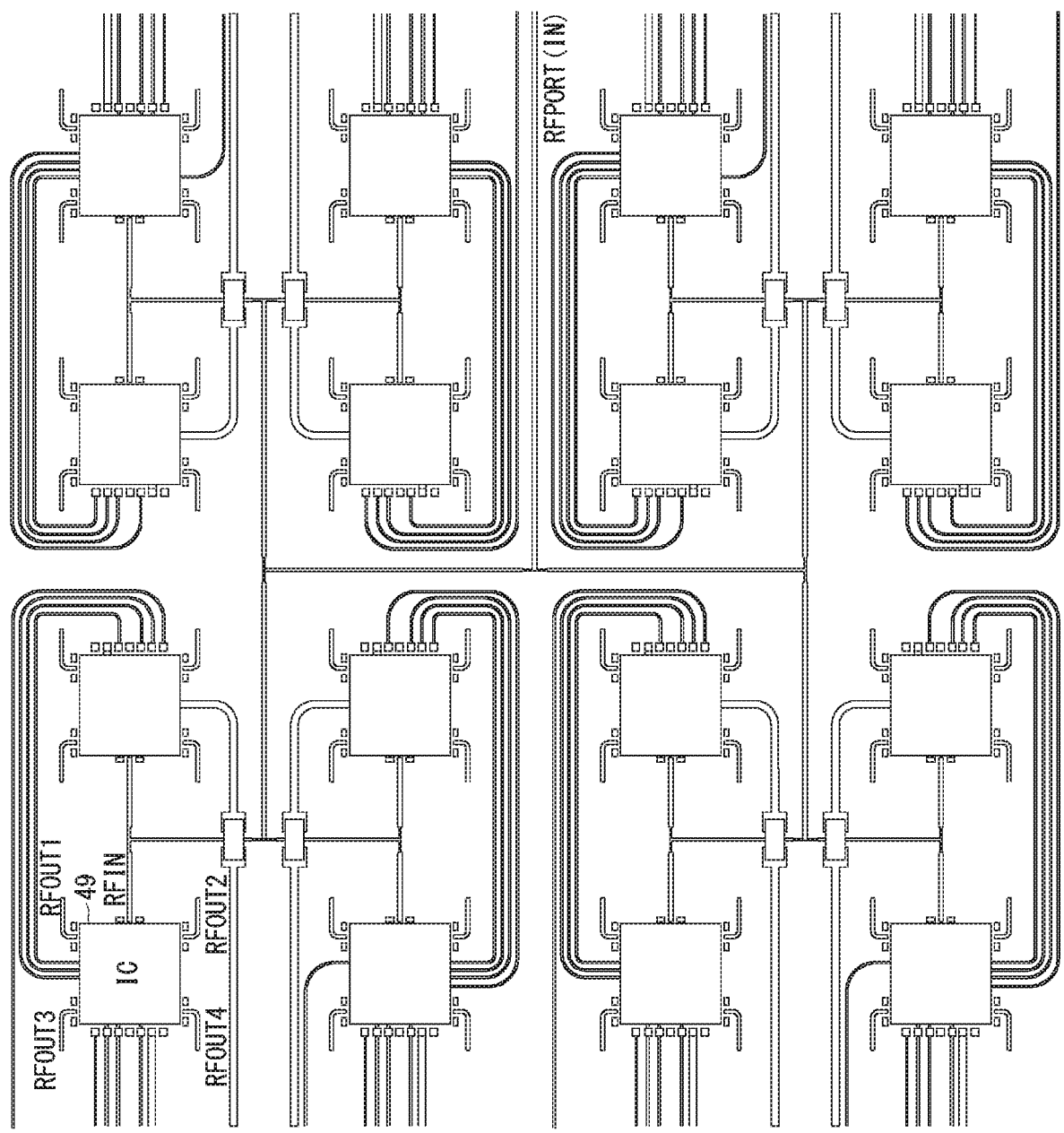
FIG. 3 illustrates a mounting example of one surface of a printed board on which a transmitter side of a communication device according to an example embodiment is mounted.
Figure 4:
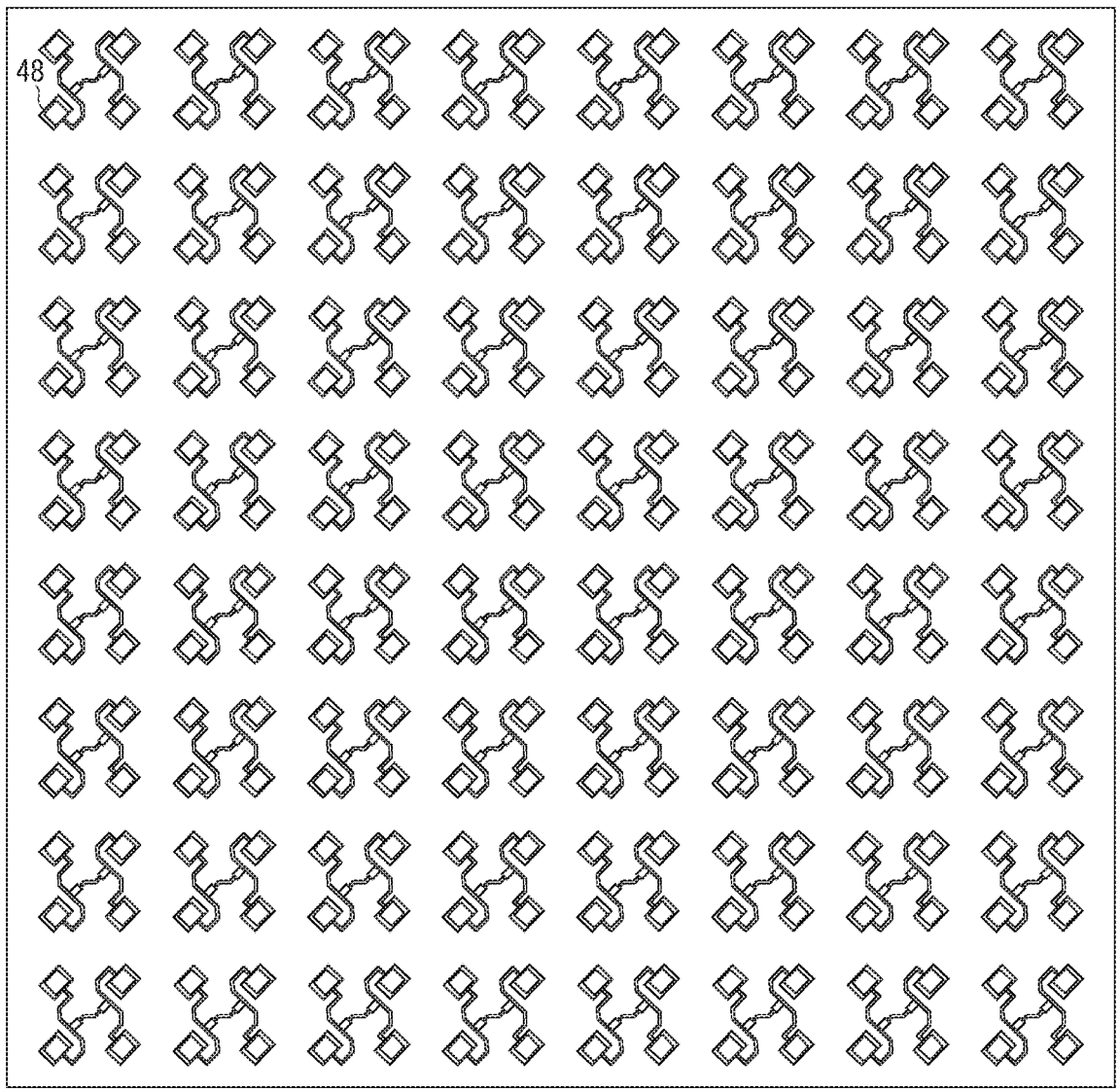
FIG. 4 illustrates a mounting example of another surface of the printed board on which the transmitter side of the communication device according to an example embodiment is mounted.

Now, with reference to FIGS. 3 and 4, a mounting example in which a transmitter side (from an RF input port RFPORT(IN) to transmission antenna elements 48) of the communication device 1 according to the present example embodiment is mounted on a printed board will be described. FIGS. 3 and 4 illustrate, respectively, one surface and its opposite surface of the printed board.

As illustrated in FIGS. 3 and 4, in the communication device 1 according to the present example embodiment, the transmission array antenna is served by a planar patch array antenna constituted by the transmission antenna elements 48 for which a printed board is used, and ICs implementing the TX circuits 49 are mounted in flip chip on the back side of the transmission antenna elements 48. The transmission array antenna may have any number of arrays. The transmission array antenna may have any shape that allows each transmission antenna element 48 constituting the transmission array antenna to be connected to a microstrip line.

In the communication device 1 according to the present example embodiment, an IC that implements a TX circuit 49 is mounted near the center of four transmission antenna elements 48. Therefore, the length of the connection between the TX circuit 49 and each of the four transmission antenna elements 48 is shortest and equal. However, when there is no restriction on the distance between the TX circuit 49 and the transmission antenna elements 48 or when the transmission array antenna has a different shape, it is not necessary that the IC be mounted near the center of the four transmission antenna elements 48. It is not necessary either that the TX circuit 49 include four circuits each constituted by a phase shifter 46 and an amplifier 47, and it suffices that the TX circuit 49 include at least one such circuit.

In the transmitter side of the communication device 1 according to the present example embodiment, a transmission RF signal that has passed through the BPF 45 is input through an input port RFPORT(IN), is distributed on the printed board, and is input to an input terminal RFIN of each IC that implements a TX circuit 49. Each transmission RF signal is further distributed into four signals within the IC. The four distributed transmission RF signals each have its phase changed by the phase shifter 46, are amplified by the amplifier 47, and then are output through respective output terminals RFOUT1 to RFUOT4. The four transmission RF signals output from the respective output terminals RFOUT1 to RFUOT4 are transmitted from the respective transmission antenna elements 48.

In this manner, the transmitter side of the communication device 1 according to the present example embodiment achieves the beam steering function by changing the phase of a transmission RF signal with a phase shifter 46 provided correspond to each transmission antenna element 48 constituting the transmission array antenna.

A mounting example in which a receiver side (from an RF output port RFPORT(OUT) to reception antenna elements 51) of the communication device 1 according to the present example embodiment is mounted on the printed board is substantially similar to that of the transmitter side. In other words, in FIGS. 3 and 4, RFPORT(IN) is replaced with RFPORT(OUT), the TX circuit 49 is replaced with the RX circuit 59, RFIN is replaced with RFOUT, RFOUT1 to RFOUT4 are replaced with RFIN1 to RFIN4, and the transmission antenna elements 48 are replaced with the reception antenna elements 51. This yields the mounting example of the printed board on which the receiver side of the communication device 1 is mounted.

In the receiver side of the communication device 1 according to the present example embodiment, an operation reverse to that in the transmitter side is carried out. Specifically, four reception RF signals received by the respective reception antenna elements 51 are input to respective input terminals RFIN1 to RFIN4 of each IC that implements an RX circuit 59. Within the IC, the four reception RF signals are amplified by the respective amplifiers 52, have their phases changed by the respective phase shifters 53, are combined, and are output through the output terminal RFOUT. Reception RF signals output through the output terminal RFOUT of the respective ICs are combined on the printed board, and the resulting signal is output to a BPF 54 from the output port RFPORT(OUT).

In this manner, the receiver side of the communication device 1 according to the present example embodiment achieves the beam steering function by changing the phase of a reception RF signal with a phase shifter 53 provided corresponding to each reception antenna element 51 constituting the reception array antenna.

An operation of the phase shifters 46 and 53 according to the present example embodiment will be described below. The operations of the phase shifters 46 and 53 are substantially identical, and thus an operation of the phase shifter 46 will be described below as an example.

In the phase shifter 46, the distributor 461 distributes a transmission RF signal into four signals having phases that differ in steps of 90°, the variable amplifiers 462 change the amplitudes of two transmission RF signals selected from the four distributed transmission RF signals as appropriate, and the combiner 463 combines these signals. In this manner, equal-amplitude transmission RF signals are generated at desired phases.

First, with reference to FIG. 5, an operation principle of the phase shifter 46 will be described. Considered herein is a case in which, with a combination of a 0-degree signal and a 90-degree signal of the four transmission RF signals distributed by the distributor 461, equal-amplitude transmission RF signals having an amplitude of 1 are generated with the phase being changed from 0° to 90° in steps of 10°.

Figure 5:
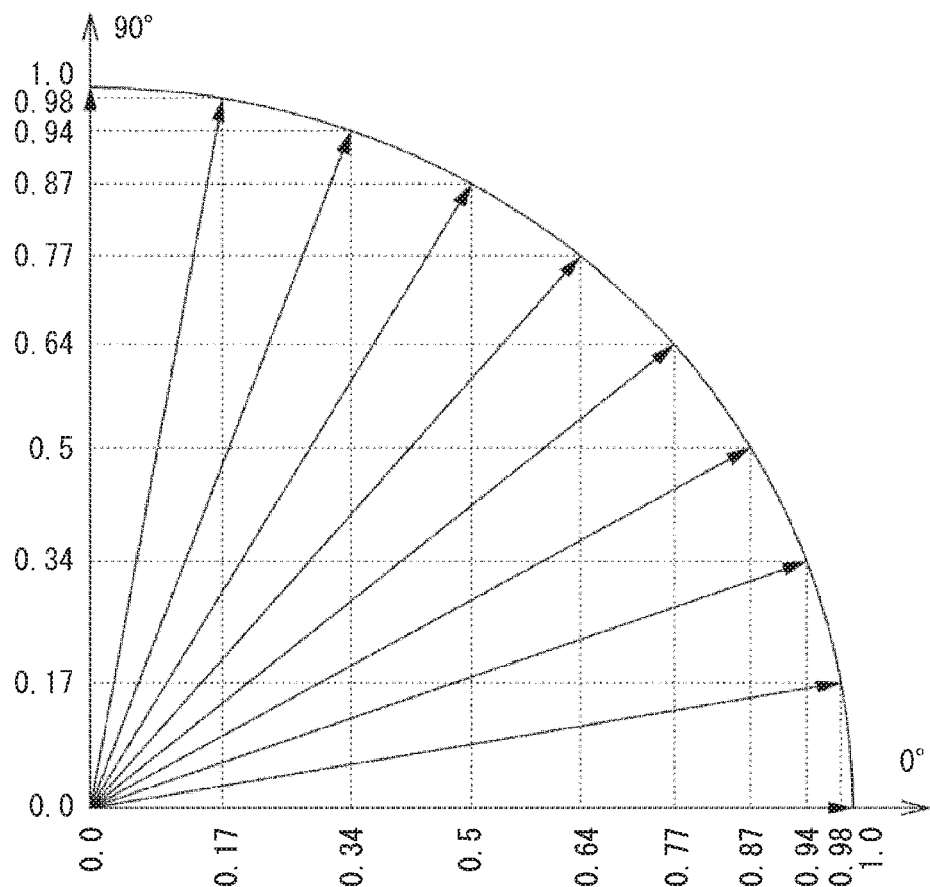
FIG. 5 is an illustration for describing an operation principle of a phase shifter according to an example embodiment.

In this case, as illustrated in FIG. 5, in steps of 10° within the phases of from 0° to 90°, the amplitude ($\cos(10°\times N)$) ($N=0, \ldots, 9$)) of the 0-degree signal is set to 1.0, 0.98, 0.94, 0.87, 0.77, 0.64, 0.5, 0.34, 0.17, and 0, and the amplitude ($\sin(10°\times N)$) of the 90-degree signal is set to 0, 0.17, 0.34, 0.5, 0.64, 0.77, 0.87, 0.94, 0.98, and 1.0. Then, the 0-degree signal and the 90-degree signal are combined at every 10°, and thus a 10-step transmission RF signal having a constant amplitude of 1 and a phase that changes in steps of 10° can be obtained.

Now, with reference to FIG. 6, an operation example of a variable amplifier 462 constituting the phase shifter 46 will be described. An operation example for achieving a 10-step 0-degree signal illustrated in FIG. 5, that is, a 0-degree signal having an amplitude ($\cos(10°\times N)$) of 1.0, 0.98, 0.94, 0.87, 0.77, 0.64, 0.5, 0.34, 0.17, and 0 will be described.

Figure 6:
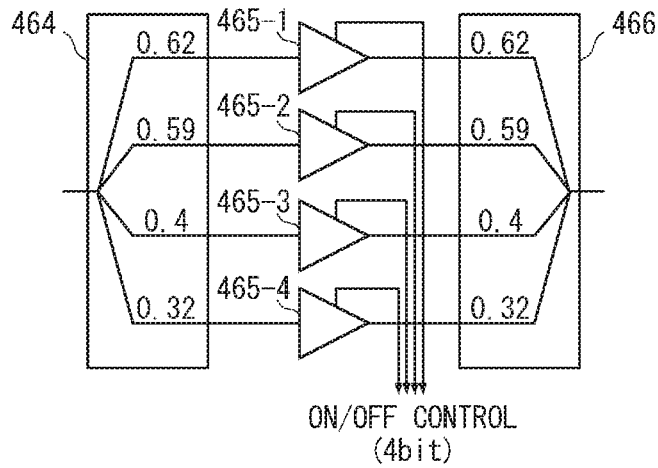
FIG. 6 is an illustration for describing an operation example of a variable amplifier constituting a phase shifter according to an example embodiment.

As illustrated in FIG. 6, in the variable amplifier 462, the power sources of the four amplifiers 465-1 to 465-4 are controlled on/off through a 4-bit control signal. The four bits of the control signal correspond to the respective amplifiers 465-1 to 465-4. In order from the highest bit, the four bits correspond to the respective amplifiers 465-1, 465-2, 465-3, and 465-4. A bit being 1 means that the power source is on, and a bit being 0 means that the power source is off.

In the variable amplifier 462, if the distribution ratio of the distributor 464 and the combining ratio of the combiner 466 are each set to 8:4:2:1, for example, a maximum of 16 steps of amplitudes can be obtained through the control with a 4-bit control signal.

However, this renders it impossible to match the 10-step 0-degree signal having an amplitude ($\cos(10°\times N)$) of 1.0, 0.98, 0.94, 0.87, 0.77, 0.64, 0.5, 0.34, 0.17, and 0 illustrated in FIG. 5. To solve this issue, the distribution ratio of the distributor 464 and the combining ratio of the combiner 466 are changed to make it possible to obtain amplitudes closest to those of the 10-step 0-degree signal illustrated in FIG. 5.

Specifically, the distribution ratio of the distributor 464 and the combining ratio of the combiner 466 are each set to 0.62:0.59:0.40:0.32 in order from the system where the amplifier 465-1 is disposed, and the distributor 464 and the combiner 466 are disposed with the four amplifiers 465-1 to 465-4 interposed therebetween. In this case, a signal in each system passes through both the distributor 464 and the combiner 466, and thus transmission RF signals each have an amplitude that is a square of the ratio in each system (e.g., the amplitude of the transmission RF signal in the system where the amplifier 465-1 is disposed is $0.62^2=0.38$). Thus, the amplitudes of the four transmission RF signals that have passed through the respective systems are 0.38:0.35:0.16:0.1 in order from the system where the amplifier 465-1 is disposed.

These four systems are controlled with control signals of 1111, 1111, 1110, 1101, 1100, 0111, 0110, 0100, 0010, and 0000. Then, a pass amplitude ratio x(n), which is the ratio of the amplitude of a transmission RF signal held before being distributed by the distributor 464 and the amplitude of a transmission RF signal held after being combined by the combiner 466, becomes x(n)=[1.0, 1.0, 0.9, 0.84, 0.74, 0.61, 0.51, 0.35, 0.16, 0] with x(n) being 1 when the control signal is 1111. As a result, the pass amplitude ratio x(n) can be substantially matched to the 10-step 0-degree signal having an amplitude (cos(10°×N)) of 1, 0.98, 0.94, 0.87, 0.77, 0.64, 0.5, 0.34, 0.17, and 0 illustrated in FIG. 5.

The allocation of the distribution ratio of the distributor 464 and of the combining ratio of the combiner 466 and the combination of on/off of the power sources of the four amplifiers 465 are so determined as to minimize an error in the phase shifter 46. In other words, the root mean square of a difference between the target "cos(10°×N)+j*sin(10°×N)" and "x(N)+j*x(9−N)" is obtained, and the allocation of the distribution ratio of the distributor 464 and of the combining ratio of the combiner 466 and the combination of on/off of the power sources of the four amplifiers 465 are so determined as to minimize the value of the root mean square.

In the foregoing, a combination of a 0-degree signal and a 90-degree signal has been described. The variable amplifier 462 can be configured in a substantially similar method also for a combination of a 90-degree signal and a 180-degree signal, for a combination of a 180-degree signal and a 270-degree signal, or for a combination of a 270-degree signal and a 360-degree signal. Then, these signals merely need to be combined by the combiner 463 in the end.

In the variable amplifier 462, m is 4, four amplifiers 465 are provided, and a 10-step transmission RF signal having phases that change in steps of 10° is generated through 4-bit control signals, but this is not a limiting example. For example, in the variable amplifier 462, m may be 3, three amplifiers 465 may be provided, and an 8-step transmission RF signal having phases that change in steps of 11.25° may be generated through 3-bit control signals.

The actual amplitude held when a transmission RF signal has passed through the variable amplifier 462 is equal to the amplitude of a signal obtained as a signal output from the 1 port of the distributor 464 is input to the 1 port of the combiner 466 and output therefrom, and thus the actual amplitude is attenuated to at least 1/16. However, this attenuation amount may be compensated for by amplifying the signal with the amplifiers 465 within the phase shifter 46 and with the amplifier 47 connected external to the phase shifter 46. The transmission RF signal is also attenuated in distribution/combination on the printed board or in wiring leading up to the antenna, but this attenuation amount can also be compensated for by amplifying the signal with the amplifiers 465 and the amplifier 47. Since the power of the transmission RF signal handled in each transmission antenna element 48 is very small, heat from power consumption does not pose much problem.

ICs that implemente the TX circuit 49 and the RX circuit 59 according to the present example embodiment each require signal interfaces for control signals with four circuits×four phases×four systems in order to control, aside from the RF signals and the power sources of the amplifiers 47 and 52, the pass gains of the variable amplifiers 462. However, a serial interface such as Serial Peripheral Interface (SPI) can be used for the signal interfaces for the control signals. Consequently, the number of signal interfaces can be reduced, and the mounting is simplified.

Figure 7:
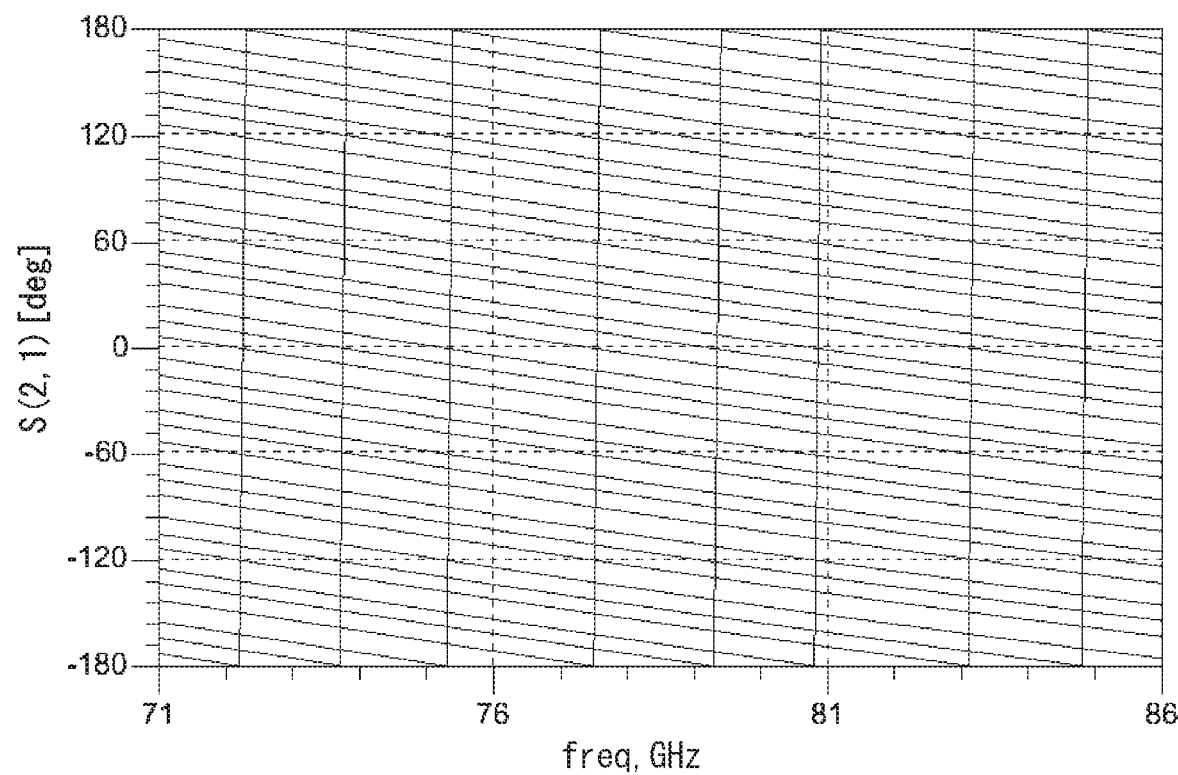
FIG. 7 is a graph illustrating a result of simulating characteristics of a phase shifter according to an example embodiment.

Now, with reference to FIGS. 7 and 8, a result of simulating the characteristics of the phase shifter 46 will be described. FIG. 7 illustrates phases obtained when, with a combination of a 0-degree signal and a 90-degree signal, the phase is changed in steps of 10° in the phase shifter 46. FIG. 7 reveals that, while the set value of the phase interval is 10°, the phase interval falls within the range of from 8.0° to 12.5°, and the phase can be changed with an accuracy of −2.0° to +2.5°.

Figure 8:
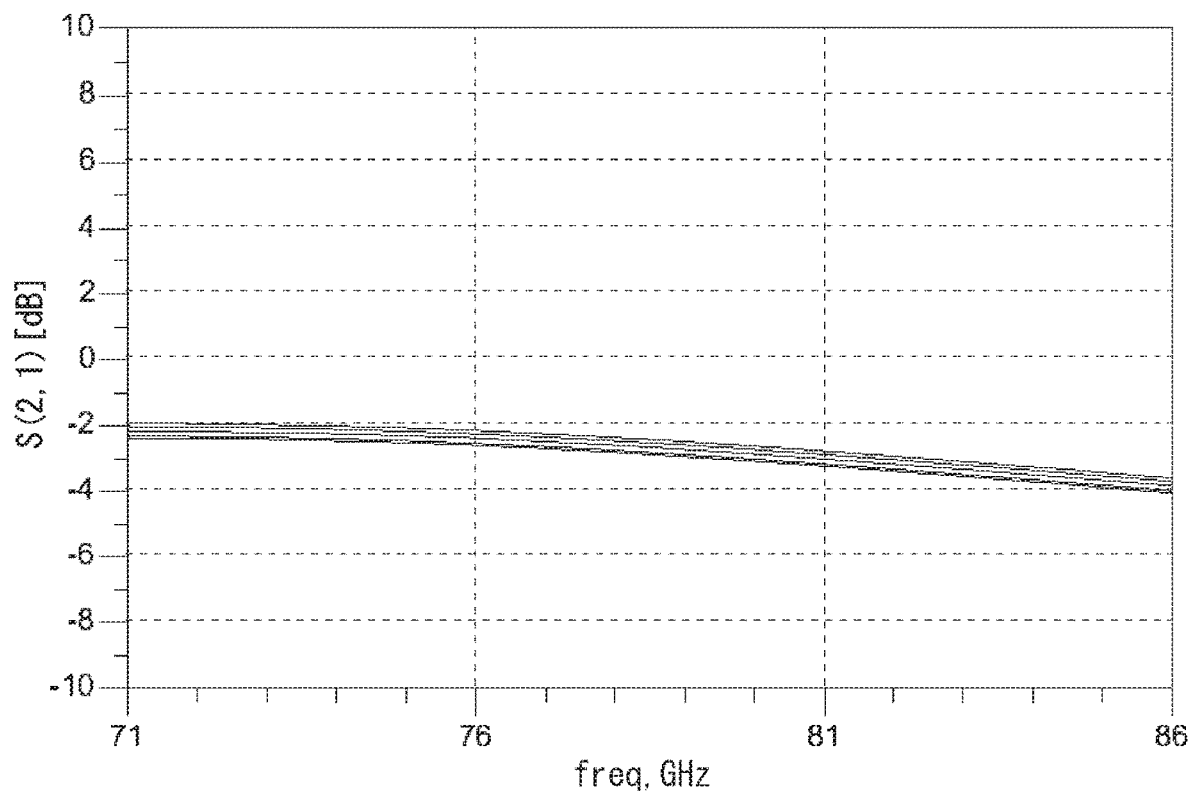
FIG. 8 is a graph illustrating a result of simulating characteristics of a phase shifter according to an example embodiment.

FIG. 8 illustrates an amplitude ratio between an input signal and an output signal obtained when the phase is changed by the phase shifter 46. FIG. 8 reveals that the amplitude variation held when the phase is changed is kept to approximately 0.5 dBp-p.

In addition, FIGS. 7 and 8 reveal that these characteristics are achieved in a broad frequency band of from 71 GHz to 86 GHz.

Now, with reference to FIG. 9, an overview of a phase shifter 60 according to the present invention will be described. The phase shifter 60 is provided corresponding to an antenna element constituting an array antenna of a communication device and changes the phase of an RF signal transmitted or received by the corresponding antenna element. Thus, the communication device achieves the beam steering function. The phase shifter 60 corresponds to the phase shifters 46 and 53 in the foregoing example embodiment.

Figure 9:
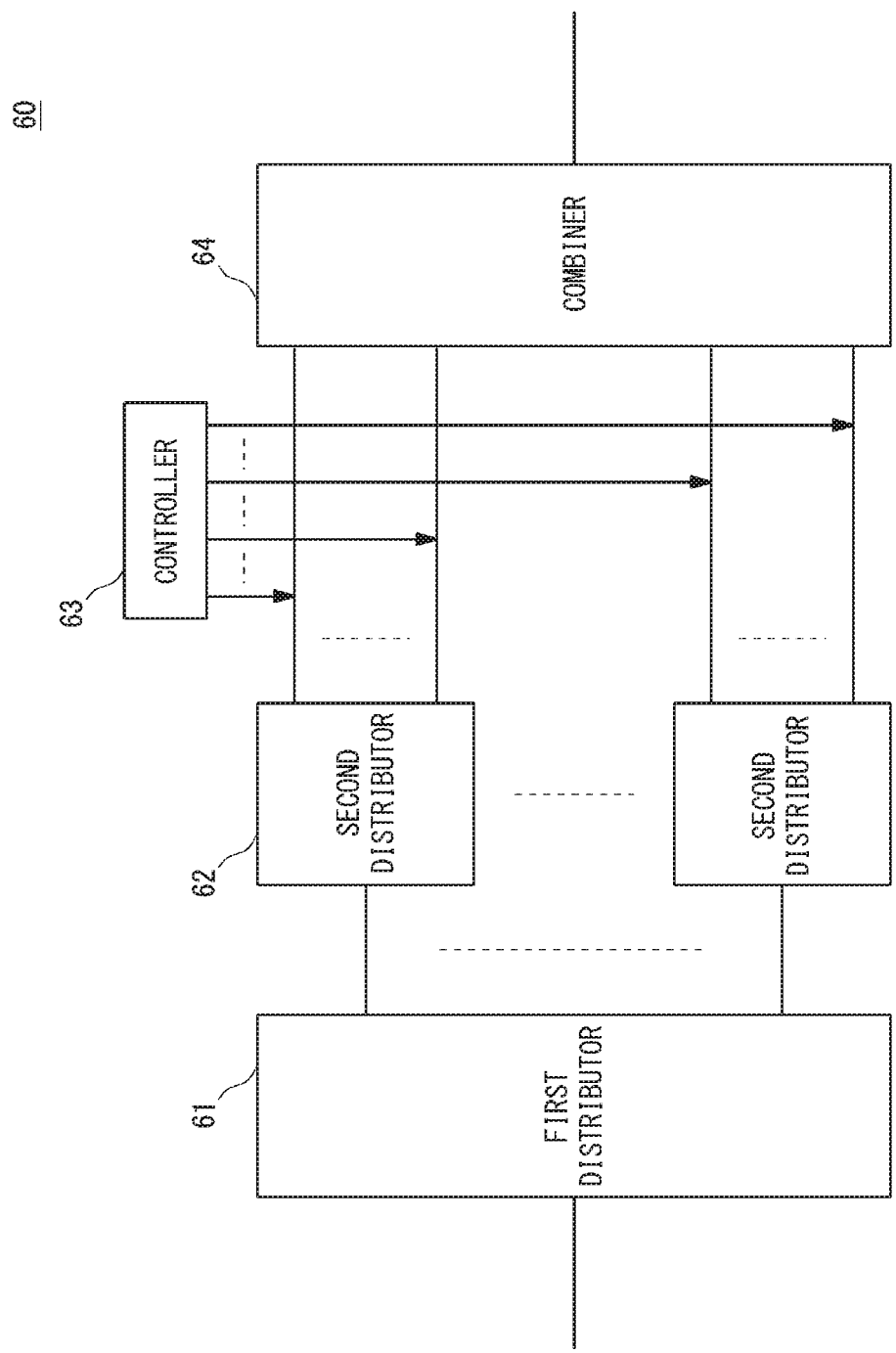
FIG. 9 is a circuit diagram illustrating a schematic circuit configuration example of a phase shifter according to the present invention.
Figure 10:
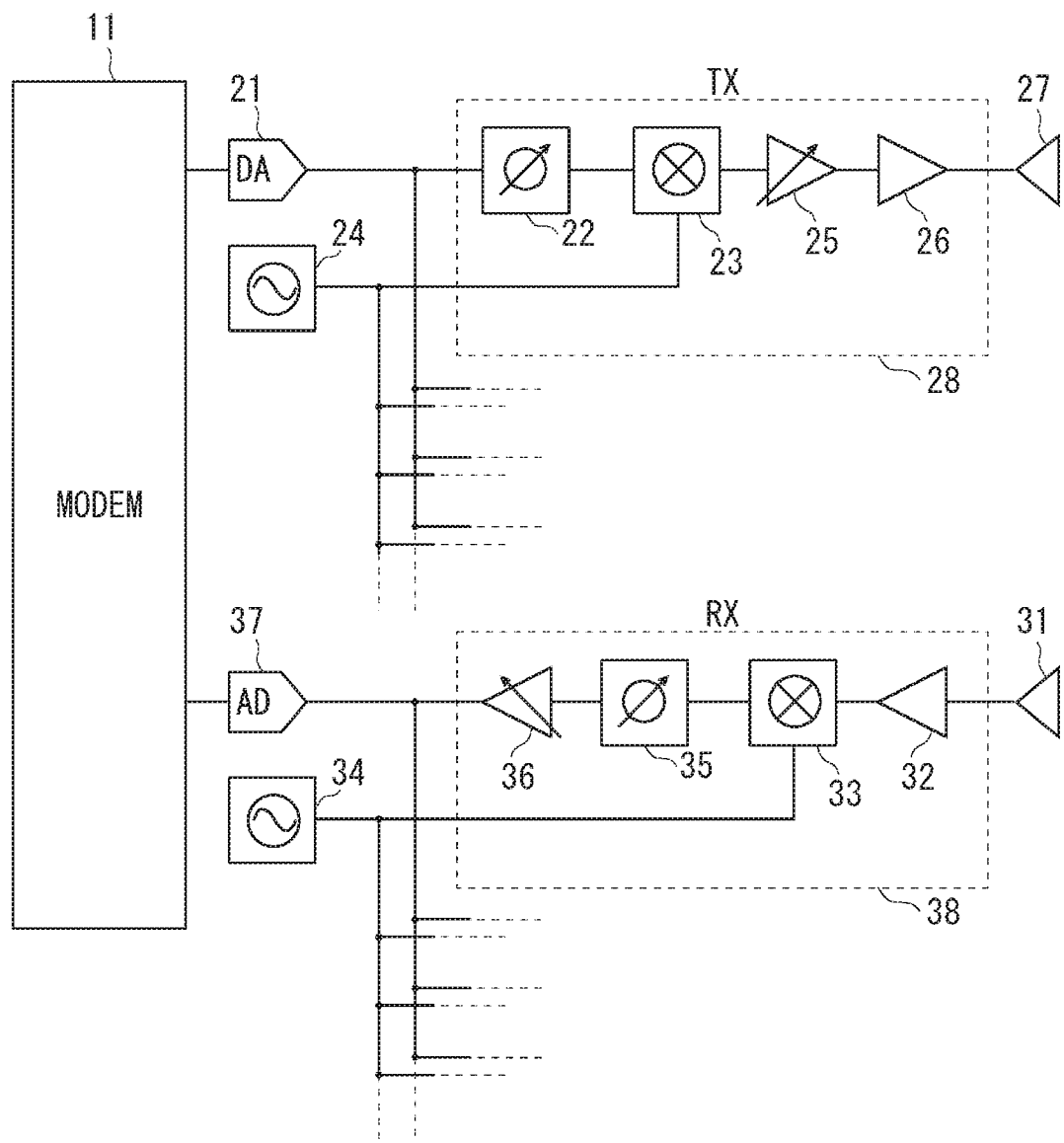
FIG. 10 is a circuit diagram illustrating a circuit configuration example of a communication device according to Related Art 1.

As illustrated in FIG. 9, the phase shifter 60 according to the present invention includes a first distributor 61, second distributors 62, a controller 63, and a combiner 64.

The first distributor 61 distributes an input RF signal into n first distributed signals having mutually different phases (n is a natural number no smaller than 2). The first distributor 61 corresponds to the distributor 461.

N second distributors 62 are provided corresponding to the respective first distributed signals. The second distributors 62 each distribute a corresponding first distributed signal into m second distributed signals having mutually different amplitudes (m is a natural number no smaller than 2). The second distributors 62 may each unequally distribute a first distributed signal into m second distributed signals having mutually different amplitudes. The second distributors 62 each correspond to the distributor 464.

The controller 63 controls on/off of the (n×m) second distributed signals. For example, (n×m) amplifiers (corresponding to the amplifiers 465) are provided corresponding to the (n×m) second distributed signals in the stage following the second distributors 62, and these amplifiers amplify the respective second distributed signals. In this case, the controller 63 may control on/off of the power sources of the (n×m) amplifiers through control signals to thus control on/off of the second distributed signals. Alternatively, (n×m) RF switches are provided corresponding to the (n×m) second distributed signals in the stage following the second distributors 62. In this case, the controller 63 may control open/close of the (n×m) RF switches through control signals to thus control on/off of the second distributed signals.

The combiner 64 combines, of the (n×m) second distributed signals, the second distributed signals that are controlled on by the controller 63. For example, the combiner 64 may be constituted by n first combiners (each corresponding to the combiner 466) that are provided corresponding to the n second distributors 62 and that each combine, of the m second distributed signals distributed by the corresponding second distributor 62, the second distributed signals that are controlled on by the controller 63, and one second combiner (corresponding to the combiner 463) that combines n signals combined by the respective first combiners. The first combiners described above may each combine the second distributed signals at a combining ratio equal to the distribution ratio of the corresponding second distributor 62.

As described above, in the phase shifter 60 according to the present invention, the first distributor 61 distributes an input RF signal into a plurality of (n) first distributed signals having mutually different phases, the second distributors 62 each distribute a first distributed signal into a plurality of (m) second distributed signals having mutually different amplitudes, the controller 63 controls on/off of the second distributed signals, and the combiner 64 combines the second distributed signals that are controlled on.

Accordingly, in the phase shifter 60 according to the present invention, the amplitude of an RF signal is controlled by controlling on/off of second distributed signals, and thus the temperature characteristics can be compensated for with ease. Unlike a voltage-controlled phase shifter, the phase shifter 60 does not include a variable capacitance element. In addition, unlike a step phase shifter, the phase shifter 60 does not require RF switches connected in multiple stages. Consequently, the beam steering function can be implemented with ease.

Thus far, the present invention has been described with reference to the example embodiments, but the present invention is not limited by the foregoing. Various modifications that a person skilled in the art can appreciate within the scope of the invention can be made to the configurations and the details of the present invention.

Part or whole of the foregoing example embodiments can also be expressed in the following supplementary notes, but the following is not limiting.

Supplementary Note 1

A phase shifter provided corresponding to an antenna element constituting an array antenna, the phase shifter being configured to change a phase of a radio frequency signal to be transmitted or received by a corresponding antenna element, the phase shifter comprising:
  a first distributor configured to distribute the radio frequency signal input thereto into a plurality of first distributed signals having mutually different phases;
  second distributors provided corresponding to the first distributed signals, the second distributors each being configured to distribute a corresponding one of the first distributed signals into a plurality of second distributed signals having mutually different amplitudes;
  a controller configured to control on/off of the second distributed signals; and
  a combiner configured to combine the second distributed signals that are controlled on by the controller.

Supplementary Note 2

The phase shifter according to Supplementary Note 1, wherein the second distributors unequally distribute the respective first distributed signals into a plurality of second distributed signals having mutually different amplitudes.

Supplementary Note 3

The phase shifter according to Supplementary Note 1 or 2, wherein the combiner includes first combiners provided corresponding to the second distributors, the first combiners each being configured to combine, of the second distributed signals distributed by a corresponding one of the second distributors, the second distributed signals that are controlled on by the controller, and
  a second combiner configured to combine signals combined by the respective first combiners.

Supplementary Note 4

The phase shifter according to Supplementary Note 3, wherein the first combiners are each configured to combine the second distributed signals at a combining ratio that is equal to a distribution ratio of a corresponding one of the second distributors.

Supplementary Note 5

The phase shifter according to any one of Supplementary Notes 1 to 4, further comprising amplifiers provided in a stage following the second distributors and corresponding to the second distributed signals, the amplifiers each being configured to amplify a corresponding one of the second distributed signals,
  wherein the controller is configured to control on/off of the second distributed signals by controlling on/off of power sources of the amplifiers.

Supplementary Note 6

The phase shifter according to any one of Supplementary Notes 1 to 4, further comprising switches provided in a stage following the second distributors and corresponding to the second distributed signals,
  wherein the controller is configured to control on/off of the second distributed signals by controlling open/close of the switches.

Supplementary Note 7

A communication device equipped with a beam steering function, the communication device comprising:
  a transmission array antenna;
  a plurality of first phase shifters provided corresponding to respective transmission antenna elements constituting the transmission array antenna, the plurality of first phase shifters each being configured to change a phase of a radio frequency signal to be transmitted by a corresponding transmission antenna element;
  a reception array antenna; and
  a plurality of second phase shifters provided corresponding to respective reception antenna elements constituting the reception array antenna, the plurality of second phase shifters each being configured to change a phase of a radio frequency signal received by a corresponding reception antenna element,
    wherein the first and second phase shifters each include
    a first distributor configured to distribute the radio frequency signal input thereto into a plurality of first distributed signals having mutually different phases,
    second distributors provided corresponding to the first distributed signals, the second distributors each being configured to distribute a corresponding one of the first distributed signals into a plurality of second distributed signals having mutually different amplitudes, a controller configured to control on/off of the second distributed signals, and a combiner configured to combine the second distributed signals that are controlled on by the controller.

Supplementary Note 8

The communication device according to Supplementary Note 7, wherein the second distributors unequally distribute the respective first distributed signals into a plurality of second distributed signals having mutually different amplitudes.

Supplementary Note 9

The communication device according to Supplementary Note 7 or 8, wherein the combiner includes first combiners provided corresponding to the second distributors, the first combiners each being configured to combine, of the second distributed signals distributed by a corresponding one of the second distributors, the second distributed signals that are controlled on by the controller, and a second combiner configured to combine signals combined by the respective first combiners.

Supplementary Note 10

The communication device according to Supplementary Note 9, wherein the first combiners are each configured to combine the second distributed signals at a combining ratio that is equal to a distribution ratio of a corresponding one of the second distributors.

Supplementary Note 11

The communication device according to any one of Supplementary Notes 7 to 10, wherein the first and second phase shifters each further include amplifiers provided in a stage following the second distributors and corresponding to the second distributed signals, the amplifiers each being configured to amplify a corresponding one of the second distributed signals, and the controller is configured to control on/off of the second distributed signals by controlling on/off of power sources of the amplifiers.

Supplementary Note 12

The communication device according to any one of Supplementary Notes 7 to 10, wherein the first and second phase shifters each further include switches provided in a stage following the second distributors and corresponding to the second distributed signals, and the controller is configured to control on/off of the second distributed signals by controlling open/close of the switches.

Supplementary Note 13

A phase shifting method for a phase shifter provided corresponding to an antenna element constituting an array antenna, the phase shifter being configured to change a phase of a radio frequency signal to be transmitted or received by a corresponding antenna element, the phase shifting method comprising:

distributing the input radio frequency signal into a plurality of first distributed signals having mutually different phases;

distributing the first distributed signals into respective pluralities of second distributed signals having mutually different amplitudes;

controlling on/off of the second distributed signals; and combining the second distributed signals that are controlled on.

REFERENCE SIGNS LIST

1 COMMUNICATION DEVICE
11 MODEM
41 D/A CONVERTER
42 MIXER
43 VCO
44 VARIABLE AMPLIFIER
45 BPF
46 PHASE SHIFTER
461 DISTRIBUTOR
462 VARIABLE AMPLIFIER
463 COMBINER
464 DISTRIBUTOR
465 AMPLIFIER
466 COMBINER
47 AMPLIFIER
48 TRANSMISSION ANTENNA ELEMENT
49 TX CIRCUIT
51 RECEPTION ANTENNA ELEMENT
52 AMPLIFIER
53 PHASE SHIFTER
54 BPF
55 MIXER
56 VCO
57 VARIABLE AMPLIFIER
58 A/D CONVERTER
59 RX CIRCUIT
αPHASE SHIFTER
61 FIRST DISTRIBUTOR
62 SECOND DISTRIBUTOR
63 CONTROLLER
64 COMBINER

The invention claimed is:

1. A communication device equipped with a beam steering function, the communication device comprising:

a transmission array antenna;

a plurality of first phase shifters provided corresponding to respective transmission antenna elements constituting the transmission array antenna, the plurality of first phase shifters each being configured to change a phase of a radio frequency signal to be transmitted by a corresponding transmission antenna element;

a reception array antenna; and a plurality of second phase shifters provided corresponding to respective reception antenna elements constituting the reception array antenna, the plurality of second phase shifters each being configured to change a phase of a radio frequency signal received by a corresponding reception antenna element, wherein the first and second phase shifters each include
a first distributor configured to distribute the radio frequency signal input thereto into a plurality of first distributed signals having mutually different phases, second distributors provided corresponding to the first distributed signals, the second distributors each being configured to distribute a corresponding one of the first distributed signals into a plurality of second distributed signals having mutually different amplitudes, a controller configured to control on/off of the second distributed signals, and a combiner configured to combine the second distributed signals that are controlled on by the controller.

2. The communication device according to claim 1, wherein the second distributors unequally distribute the respective first distributed signals into a plurality of second distributed signals having mutually different amplitudes.

3. The communication device according to claim 1, wherein the combiner includes first combiners provided corresponding to the second distributors, the first combiners each being configured to combine, of the second distributed signals distributed by a corresponding one of the second distributors, the second distributed signals that are controlled on by the controller, and a second combiner configured to combine signals combined by the respective first combiners.

4. The communication device according to claim 3, wherein the first combiners are each configured to combine the second distributed signals at a combining ratio that is equal to a distribution ratio of a corresponding one of the second distributors.

5. The communication device according to claim 1, wherein the first and second phase shifters each further include amplifiers provided in a stage following the second distributors and corresponding to the second distributed signals, the amplifiers each being configured to amplify a corresponding one of the second distributed signals, and the controller is configured to control on/off of the second distributed signals by controlling on/off of power sources of the amplifiers.

6. The communication device according to claim 1, wherein the first and second phase shifters each further include switches provided in a stage following the second distributors and corresponding to the second distributed signals, and the controller is configured to control on/off of the second distributed signals by controlling open/close of the switches.

* * * * *

UNITED STATES PATENT AND TRADEMARK OFFICE
CERTIFICATE OF CORRECTION

PATENT NO.       : 10,797,772 B2                           Page 1 of 1
APPLICATION NO.  : 16/491653
DATED            : October 6, 2020
INVENTOR(S)      : Toshihide Kuwabara It is certified that error appears in the above-identified patent and that said Letters Patent is hereby corrected as shown below:

In the Specification

Column 18, Reference Signs List, Line 39; Delete "αPHASE" and insert --60 PHASE-- therefor Signed and Sealed this
Twenty-second Day of December, 2020

Andrei Iancu
*Director of the United States Patent and Trademark Office*